(12) United States Patent
Jung

(10) Patent No.: US 8,878,291 B2
(45) Date of Patent: Nov. 4, 2014

(54) SEMICONDUCTOR DEVICE AND METHOD OF FABRICATING THE SAME

(71) Applicant: SK Hynix Inc., Icheon (KR)

(72) Inventor: Yong Sun Jung, Icheon (KR)

(73) Assignee: SK Hynix Inc., Icheon (KR)

( * ) Notice: Subject to any disclaimer, the term of this patent is extended or adjusted under 35 U.S.C. 154(b) by 70 days.

(21) Appl. No.: 13/714,310

(22) Filed: Dec. 13, 2012

(65) Prior Publication Data

US 2014/0027844 A1    Jan. 30, 2014

(30) Foreign Application Priority Data

Jul. 30, 2012  (KR) .......................... 10-2012-0083218

(51) Int. Cl.
*H01L 29/423* (2006.01)
*H01L 27/112* (2006.01)

(52) U.S. Cl.
CPC .... *H01L 29/42356* (2013.01); *H01L 27/11206* (2013.01)
USPC ....... 257/331; 257/50; 257/530; 257/E23.147

(58) Field of Classification Search
CPC . H01L 29/423; H01L 29/42356; H01L 29/78; H01L 29/7827; H01L 29/7834

USPC .............................. 257/331, 50, 530, E23.147
See application file for complete search history.

(56) References Cited

U.S. PATENT DOCUMENTS

| 5,708,286 A * | 1/1998 | Uesugi et al. ................. 257/330 |
| 7,532,496 B1 * | 5/2009 | Bu ................................... 365/94 |
| 2002/0119637 A1 * | 8/2002 | Bertin et al. .................. 438/423 |
| 2002/0185684 A1 * | 12/2002 | Campbell et al. ............ 257/347 |
| 2009/0250726 A1 * | 10/2009 | Kurjanowicz ................. 257/209 |

FOREIGN PATENT DOCUMENTS

| KR | 10-0612708 B1 | 8/2006 |
| KR | 10-2011-0014581 A | 2/2011 |

\* cited by examiner

*Primary Examiner* — Long K Tran
*Assistant Examiner* — Jordan Klein

(57) ABSTRACT

A semiconductor device includes a first buried gate structure in a peripheral circuit area of a semiconductor substrate, and a second gate structure formed on the semiconductor substrate. A gate insulating layer of a program transistor is thinly formed to be easily ruptured, and a gate insulating layer of a select transistor is thickly formed to improve reliability of the select transistor.

6 Claims, 5 Drawing Sheets

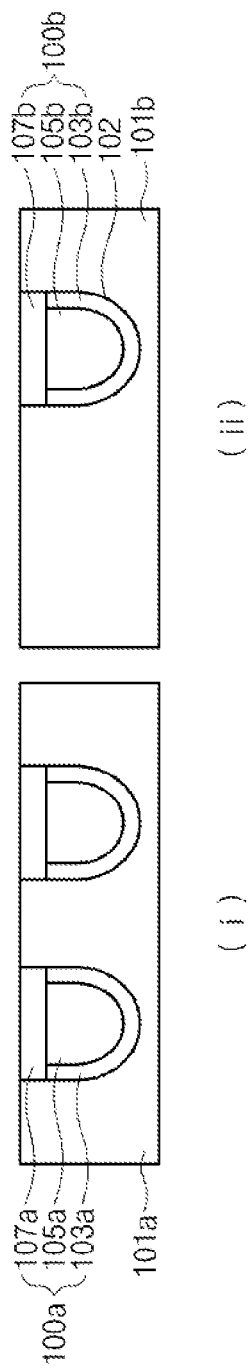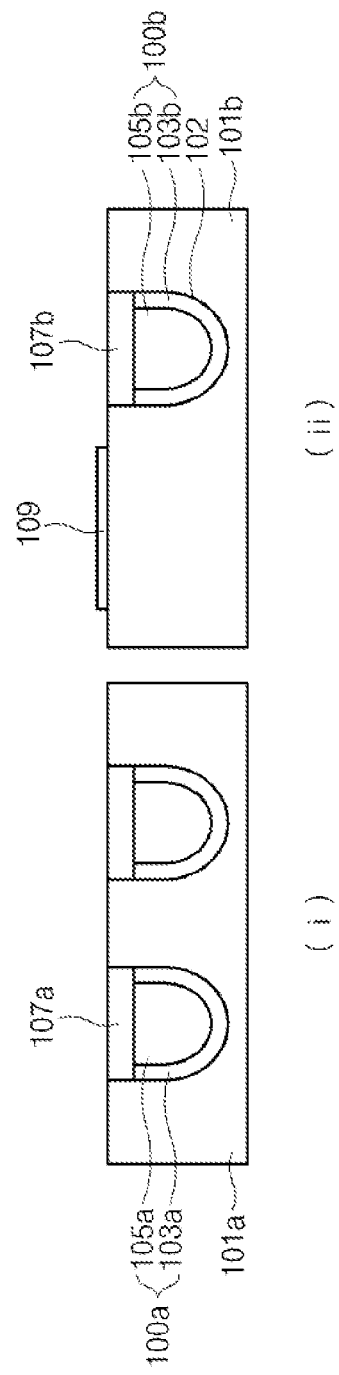
Fig.3a
Fig.3b

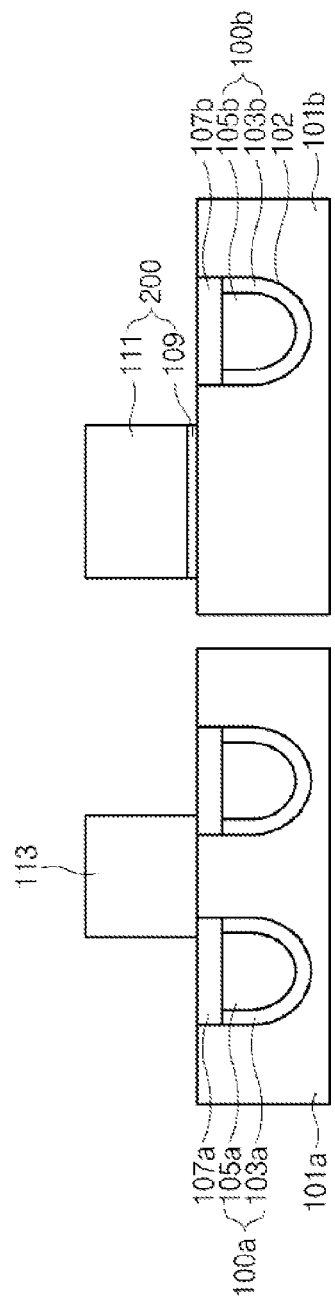
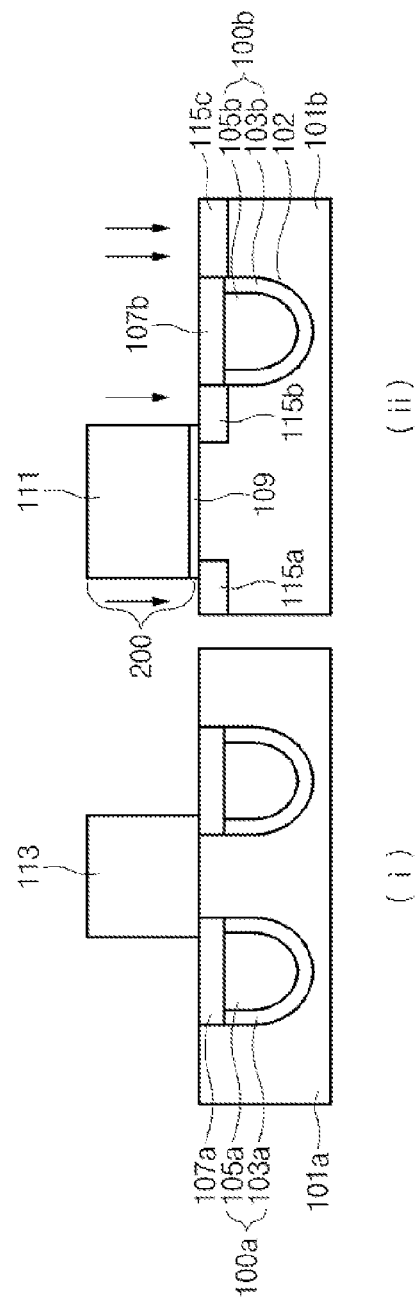
Fig.3c
Fig.3d

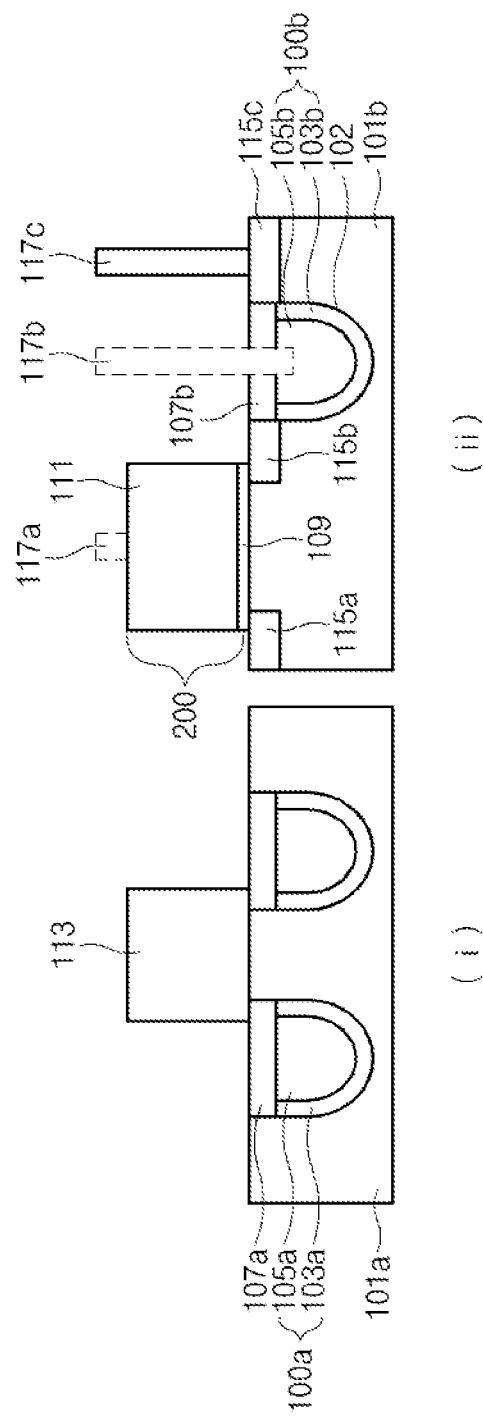

SEMICONDUCTOR DEVICE AND METHOD OF FABRICATING THE SAME

CROSS-REFERENCES TO RELATED APPLICATION

This application claims priority under 35 U.S.C. 119(a) to Korean application number 10-2012-0083218, filed on Jul. 30, 2012, in the Korean Patent Office, which is incorporated by reference herein in its entirety.

BACKGROUND OF THE INVENTION

1. Technical Field

The present invention relates to a semiconductor device and a method of fabricating the same, and more particularly, to technology for dual structure antifuse technology in which a planar gate and a buried gate are formed.

2. Related Art

In recent years, with the rapid spread of information media such as computers, semiconductor devices have been developed to operate the information media. In terms of function, desirable characteristics of semiconductor devices include high-speed operation and large storage capacity. Thus, fabrication technology of the semiconductor devices have been developed to improve integration, reliability, and response speed.

Existing methods of fabricating semiconductor devices include a fabrication (FAB) process which repeatedly forms preset circuit patterns on a substrate which is typically formed of a silicon material to form cells having integrated circuits, and an assembly process which packages the substrate in which the cells are formed in units of chips. An electrical die sorting (EDS) process for testing electrical characteristics of the cells may be performed before assembly.

The EDS process determines whether the cells formed on the substrate are in an electrically good state or in a failed state. The cells in the failed state are removed during the EDS process before the assembly process is performed to improve cost and efficiency. In addition, defective cells may be detected in advance and then repaired through a repair process.

Hereinafter, the repair process will be described.

Redundant cells are added to a semiconductor device, and may be used to replace failed circuits to improve yields. Fuses are designed to disconnect the failed cells in an integrated circuit. When a failed circuit is detected, a fuse may be cut to replace the failed circuit with redundant cells.

Even after the EDS repair process has been performed to repair the defected cells at the wafer level, 1-bit or 2-bit defects may occur in a device that passed the EDS test after the package process is performed. Thus, even when the EDS process is performed at the wafer level, a defect rate of, for example, about 10% may occur in packaged devices, and thus a repair process following the packaging process is performed. In particular, in multi-chip packages, dynamic random access memories (DRAMs), and relatively high-priced flash RAMs, 1-bit or 2-bit defects occurring or detected after packaging may cause a device to fail. Thus, a repair process performed on packaged devices can improve manufacturing yields and reduce the chance of shipping defective units.

However, laser repair equipment used before packaging may not be usable following the packaging process, so a repair process after packaging may use different types of fuses and techniques from the repair process prior to packaging.

Hereinafter, a fuse used in the repair process following packaging will be described.

A fuse used in the repair process following the packaging process is an antifuse. This is because the repair process prior to the packaging process is performed by cutting fuses, while the repair process following the packaging process is performed not by cutting the fuses to break an electrical connection, but by establishing an electrical connection between elements that were not previously connected. Thus, an antifuse may be a fuse which is electrically opened-circuited in a normal state, and is short-circuited when an insulator between conductors is ruptured by applying a high voltage. The antifuse is formed in a peripheral circuit area and redundant cells for the antifuse are also formed in the peripheral circuit area. The redundant cells may be static random access memories (SRAM) with non-refresh characteristics.

The antifuse enables repairs at the package level, and may be used to increase a net yield, improve product characteristics, and avoid dependence on the prior laser fuse equipment and processes.

Thus, it is important to ensure successful rupture and reliability of a gate oxide layer in an antifuse.

SUMMARY

Embodiments of a semiconductor device and a method of fabricating the same include a dual structure antifuse using a planar gate structure and a buried gate structure.

According to one aspect of an embodiment, there is a provided a semiconductor device. The semiconductor device may include: a first gate structure formed to be buried in a semiconductor substrate of a peripheral circuit area; and a second gate structure formed on the semiconductor substrate.

The semiconductor device may further include first and second metal contacts formed to be connected to the first gate structure and the second gate structure; and a third metal contact formed on a drain region or a source region connected to the first gate structure.

The second gate structure may be driven as a program gate and the first gate structure may be driven as a select gate.

The second gate structure may include a second gate insulating layer formed on the semiconductor substrate to a preset thickness; and a conductive layer formed on the second gate insulating layer.

The first gate structure may include a first gate insulating layer formed in a trench formed in the semiconductor substrate; a conductive layer formed on the first gate insulating layer to be filled within the trench to a preset thickness; and a hard mask layer formed on the conductive layer.

The second gate insulating layer may have a thickness thinner than the first gate insulating layer.

The second gate insulating layer may have the thickness of 20 to 30 Å and the first gate insulating layer may have the thickness of 50 to 60 Å.

The first gate insulating layer may have the same thickness as that of a gate insulating layer formed below a buried gate of a cell area of the semiconductor device.

A channel may be formed below the first gate insulating layer when the second gate oxide layer is ruptured.

According to another aspect of an exemplary embodiment, there is a provided a method of fabricating a semiconductor device. The method may include: forming a first gate structure buried in a semiconductor substrate of a peripheral circuit area; and forming a second gate structure at a side of the first gate structure on the semiconductor substrate.

The method may further include forming a first metal contact and a second metal contact on the first gate structure and the second gate structure.

The method may further include forming a third metal contact on a drain region or a source region at a side of the first gate structure.

The forming a first gate structure may further include: forming a trench by etching the semiconductor substrate; forming a first gate insulating layer along a step of an entire structure including the trench; forming a conductive layer on the first gate insulating layer to be buried within the trench; etching the conductive layer and the first gate insulating layer to a constant depth; and forming a hard mask layer on the conductive layer and the first gate insulating layer.

The forming a first gate structure may include simultaneously forming the first gate structure in the peripheral circuit area when a buried gate structure in a cell area is formed.

The forming a first gate structure may include forming the first gate insulating layer having the same thickness as a gate insulating layer of the buried gate structure in the cell area.

The first gate insulating layer may have the thickness of 50 to 60 Å.

The forming a second gate structure may include: forming the second gate insulating layer on one side of the semiconductor substrate in which the first gate structure is formed; and forming a planar gate by depositing a conductive material on the second gate insulating layer.

The second gate insulating layer may be formed to be thinner than that of the first gate insulating layer.

The second gate insulating layer may be formed to a thickness of 20 to 30 Å.

The forming a first metal contact and a second metal contact may include: forming an interlayer insulating layer entirely on the semiconductor substrate including the first gate structure and the second gate structure; etching the interlayer insulating layer on the first gate structure to form a first metal contact hole; etching the interlayer insulating layer on the second gate structure and the hard mask layer and a portion of the conductive layer of the second gate structure to form a second metal contact hole; and depositing a conductive material within the first and second metal contact holes to form the first and second metal contacts.

The forming a first metal contact and a second metal contact may be simultaneously performed when a metal contact in a peripheral area of a cell mat is formed.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 3A to 3E are cross-sectional views for processes illustrating a method of fabricating a semiconductor device including an antifuse according to an embodiment of the present invention.

DETAILED DESCRIPTION

Figure 1:
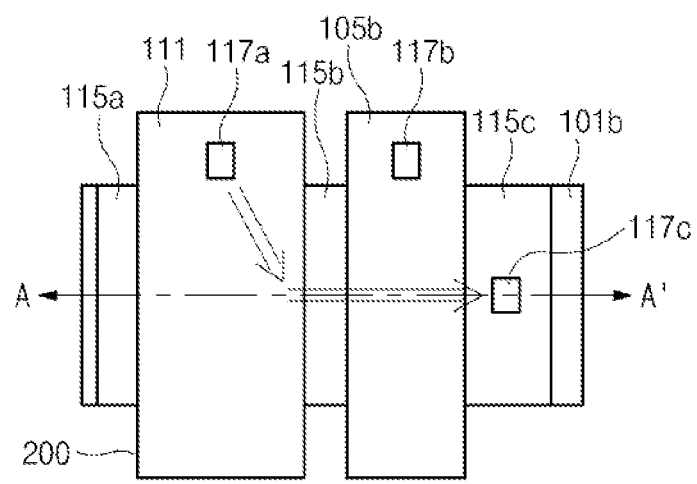
FIG. 1 is a plan view illustrating an antifuse according to an embodiment of the present invention.

Hereinafter, embodiments will be described in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

An antifuse array includes a program transistor and a select transistor, and a voltage is applied to each of the transistors through metal contacts connected thereto.

In an antifuse operation, a gate insulating layer of the program transistor is ruptured when a high voltage is applied through a metal contact connected to a program gate, and a channel region is formed below and around a select gate when a constant voltage is applied through the metal contact connected to the select gate, so that a voltage applied to the program gate is applied through the channel region below the select gate. Thus, the gate insulating layer of the program transistor may have a low thickness so that the gate insulating layer of the program transistor is easily ruptured in an antifuse operation, and a gate insulating layer of the select transistor is formed to have a thickness that is above a predetermined thickness to isolate the select transistor from the voltage in the channel region.

Hereinafter, embodiments of the present invention will be described in detail with reference to FIGS. 1 to 3E.

Figure 2:
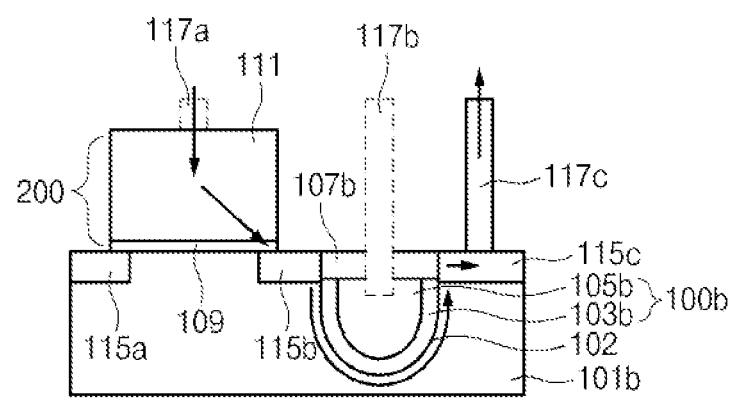
FIG. 2 is a cross-sectional view illustrating an antifuse according to an embodiment of the present invention.

FIG. 1 is a plan view of a semiconductor device according to an embodiment, and FIG. 2 is a cross-sectional view of the device taken along a line A-A' of FIG. 1.

A semiconductor device according to an embodiment has a dual gate structure including a planar gate structure 200 on a semiconductor substrate 101b of a peripheral circuit area and a buried gate structure 100b buried in the semiconductor substrate 101b. In an embodiment, the planar gate structure 200 is used as a program gate and the buried gate structure 100b is used as a select gate.

A gate insulating layer 109 of the planar gates structure 200 is thinly formed and a gate insulating layer 103b of the buried gate structure 100b is formed to be thicker than that of the gate insulating layer 109 of the planar gate structure 200. The gate insulating layer 103b of the buried gate structure 100b may have the same thickness as a gate insulating layer (not shown) of a buried gate structure (not shown) in a cell area. In particular embodiments, the gate insulating layer 109 of the planar gate structure 200 may have a thickness of 20 to 30 Å, and the gate insulating layer 103b of the buried gate structure 100b may have a thickness of 50 to 60 Å. Metal contacts 117a to 117c are formed on the planar gate structure 200, the buried gate structure 100b, and drain/source regions 115c. when viewed in a cross-section taken along a line A-A' of FIG. 1, the metal contact 117a formed on the planar gate structure 200 and the metal contact 117b formed on the buried gate structure 100b are not illustrated and thus the metal contacts 117a and 117b are indicated by a dotted line in FIG. 2.

An operation of the antifuse having the above-described structure will be described below.

First, when a high voltage is applied through the metal contact 117a formed on the planar gate structure 200 used as the program gate, the gate insulating layer 109 is ruptured and thus a current flows along a step below the buried gate structure 100b through the source/drain regions 115b and flows out through the metal contact 117c (see arrows of FIGS. 1 and 2).

A constant voltage (middle voltage) is applied to the metal contact 117b on the buried gate structure 100b used as the select gate to allow a channel region to be formed below the buried gate structure 100b. When the constant voltage is applied, a portion of the substrate 101b surrounding the gate insulating layer 103b is activated to provide an electrical path between source/drain region 115b and source/drain region 115c, so that electricity flows from metal contact 117a to metal contact 117c. An exemplary channel region flow path is shown by the curved arrow under gate insulating layer 103b shown in FIG. 2.

As described above, in an embodiment of a semiconductor device having a dual structure of the planar gate structure 200 and the buried gate structure 100b of the embodiment of FIG. 2, the gate oxide layer 109 of the planar gate structure 200 used as the program gate has a low thickness configured to cause a fuse to be easily ruptured, and the gate oxide layer 103b below the buried gate structure 100b used as the select gate has a greater thickness to prevent degradation of the select gate.

Hereinafter, a method of fabricating a semiconductor device according to an embodiment will be described with reference to FIGS. 3A to 3E.

First, as shown in FIG. 3A, buried gate structures 100a and 100b are formed in trenches 102 formed in portions 101a and 101b (which may be referred to as semiconductor substrates 101a and 101b, respectively) of a semiconductor substrate in a cell area (i) and a peripheral circuit area (ii), respectively.

In an embodiment, a hard mask pattern (not shown) is formed on the portions 101a and 101b of the semiconductor substrate in the cell area (i) and the peripheral area (ii), and the portions 101a and 101b of the semiconductor substrate are etched using the hard mask pattern (not shown) as an etching barrier to form the trenches 102. Then, a gate oxide layer is formed over an upper surface of the semiconductor including the trenches 102, and a conductive layer is deposited on the gate oxide layer to fill the trenches 102. Subsequently, an etch back process is performed to partially etch the gate oxide layer and the conductive layer so that gate oxide layers 103a and 103b and conductive layers 105a and 105b are formed in the trenches 102 in the cell area (i) and the peripheral circuit area (ii). Then, hard mask layers 107a and 107b are formed on the conductive layers 105a and 105b and the gate oxide layers 103a and 103b to be filled within the trenches 102 so that the buried gate structures 100a and 100b are simultaneously formed in the cell area (i) and the peripheral circuit area (ii). In an embodiment, the conductive layers 105a and 105b may include metal such as tungsten (W), titanium (Ti), or titanium nitride (TiN) or polysilicon. The hard mask layer serves as a capping layer and may include a nitride layer or an oxide layer. The gate insulating layers 103a and 103b may include an oxide layer.

A gate oxide layer is formed on the semiconductor substrate 101b and a photoresist layer is formed on the gate oxide layer. The photoresist layer is etched using a peripheral open mask (not shown) which covers the cell area (i) and is open in the peripheral circuit area (ii) to form a photoresist mask (not shown) on the semiconductor substrate 101b of the peripheral circuit area (ii). Then, the gate oxide layer is etched using the photoresist mask (not shown) as an etch mask to form the gate oxide layer 109 in a regular pattern on the semiconductor substrate 101b of the peripheral circuit area (ii).

Referring to FIG. 3C, the photoresist mask (not shown) is removed and a conductive layer is formed on the semiconductor including the gate insulating layer 109. A photoresist mask (not shown) is formed on the conductive layer and then the conductive layer is etched using the photoresist mask as an etch mask to form a bit line 113 on the semiconductor substrate 101a of the cell area (i). Simultaneously, a conductive layer 111 is deposited on the gate oxide layer 109 on the semiconductor substrate 101b of the peripheral circuit area (ii) to form a planar gate structure 200. Although not shown in the drawings, an ion implantation process to create source/drain regions may be performed on the semiconductor substrate 101a of the cell area (i) before forming the bit line 113.

The bit line 113 of the cell area (i) may be formed of a conductive material. In an embodiment, the bit line 113 may be formed by sequentially stacking a polysilicon layer (not shown) and a tungsten layer (not shown). The bit line 113 of the cell area (i) is formed on the semiconductor substrate 101a between neighboring buried gate structures 100a, and the planar gate structure 200 of the peripheral circuit area (ii) is formed on the semiconductor substrate 101b on a side of the buried gate structure 100b.

As shown in FIG. 3D, an ion implantation process is performed on the semiconductor substrate 101b of the peripheral circuit area (ii) to form source/drain regions 115a to 115c. In an embodiment, when the semiconductor substrate is a p-type well, N+ ions are implanted to form the source/drain regions 115a to 115c.

As shown in FIG. 3E, metal contacts 117a to 117c are formed on the planar gate structure 200, the buried gate structure 100b, and the source/drain region 115c of the peripheral area (ii), respectively. In an embodiment, although not shown in FIG. 3E, when the metal contacts 117a to 117c are formed in the peripheral circuit area (ii), metal contacts (not shown) may be simultaneously formed on a buried gate (not shown) and an active region (not shown) in a peripheral area of the cell area (i).

In an embodiment, before the metal contacts 117a to 117c are formed, an interlayer insulating layer (not shown) is deposited on surfaces of the semiconductor substrate 101a and 101b including the planar gate structure 200 and then etched to form metal contact holes (not shown). Then, a conductive material is deposited within the metal contact holes to form the metal contacts 117a to 117c.

When the metal contact 117b is formed on the buried gate structure 100b, the hard mask layer 107b and a portion of the conductive layer 105b are further etched to form a contact hole (not shown) and then the metal contact 117b is formed to be in contact with the conductive layer 105b. In an embodiment, as shown in FIG. 3e, the bottom of the contact hole may be disposed below a lower surface of mask layer 107b.

In the semiconductor device in the embodiment described above, the program gate is formed as a planar gate type and the select gate is formed as a buried gate type so that the program gate is formed on the thinner gate insulating layer 109 and the select gate is formed on the thicker gate insulating layer 103b. An antifuse structure includes at least gate insulating layer 109 which is ruptured in an antifuse operation, and may also include structures in the electrical path between metal contact 117a and metal contact 117c as shown by the arrows of FIG. 2 that is established by the antifuse operation.

As described above, in an embodiment, a buried select gate is formed in the peripheral circuit area, and a program gate is formed on the semiconductor substrate separately from the select gate in the same process. When the program gate is formed separately from the select transistor, the gate oxide layer can be thinly formed in the same process as forming a buried gate. Thus, it may not be necessary to perform a separate process of forming the gate insulating layers of the select transistor and the program data to have different thickness from each other or without a separate space for formation of the select gate. Therefore, the process can be simplified without increasing a size of a fuse set.

In an embodiment, the gate insulating layer of the program transistor is thinly formed to be easily ruptured, and at the same time, the gate insulating layer of the select transistor is thickly formed to improve reliability of the select transistor.

Although an example in which the dual gate of the buried gate and the planar gate is formed in the peripheral circuit area has been illustrated, the present invention may be applied to any structure in which a dual-layered gate is used.

Embodiments of the present invention may have one or more of the following advantages.

First, a gate insulating layer of a program transistor is thinly formed to be easily ruptured and simultaneously a gate insulating layer of a select transistor is thickly formed to improve reliability of the select transistor.

Second, a buried gate in a peripheral circuit area is simultaneously formed when a buried gate in a cell area is formed and thus a separate process and a separate spacer are not necessary to form a dual structure.

While certain embodiments have been described above, it will be understood that the embodiments described are only examples. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A semiconductor device, comprising:
   a first buried gate structure including a first gate insulating layer in a semiconductor substrate of a peripheral circuit area;
   a second gate structure including a second gate insulating layer formed on the semiconductor substrate,
   wherein a thickness of the second gate insulating layer is less than a thickness of the first gate insulating layer;
   wherein the second gate structure includes a conductive layer on the second gate insulating layer; and
   wherein the first gate structure includes:
      the first gate insulating layer formed in a trench in the semiconductor substrate;
      the conductive layer formed on the first gate insulating layer within the trench and having a predetermined thickness; and
      a hard mask layer formed on the conductive layer.

2. The semiconductor device of claim 1, further comprising:
   first and second metal contacts coupled to the first gate structure and the second gate structure respectively; and
   a third metal contact formed on a drain region or a source region and coupled to the first gate structure.

3. The semiconductor device of claim 1, wherein the second gate structure is driven as a program gate and the first gate structure is driven as a select gate.

4. The semiconductor device of claim 1, wherein the thickness of the second gate insulating layer is 20 to 30 Å and the thickness of the first gate insulating layer is 50 to 60Å.

5. The semiconductor device of claim 1, wherein the thickness of the first gate insulating layer is the same as the thickness of a gate insulating layer formed in a buried gate of a cell area of the semiconductor device.

6. The semiconductor device of claim of claim 1, wherein a channel is formed below the first gate insulating layer when the second gate insulating layer is ruptured.

* * * * *